United States Patent
Bygdö et al.

(10) Patent No.: US 7,965,520 B2
(45) Date of Patent: Jun. 21, 2011

(54) ELECTRONIC DEVICE WITH FLIP MODULE HAVING LOW HEIGHT

(75) Inventors: Håkan Bygdö, Lund (SE); Per Holmberg, Dalby (SE)

(73) Assignee: Sony Ericsson Mobile Communications AB, Lund (SE)

( * ) Notice: Subject to any disclaimer, the term of this patent is extended or adjusted under 35 U.S.C. 154(b) by 0 days.

(21) Appl. No.: 11/625,426

(22) Filed: Jan. 22, 2007

(65) Prior Publication Data
US 2008/0174972 A1 Jul. 24, 2008

(51) Int. Cl.
*H05K 9/00* (2006.01)
(52) U.S. Cl. ........ 361/818; 361/737; 361/752; 361/760; 361/790
(58) Field of Classification Search .......... 361/818, 361/737, 752, 760, 790; 257/686, 691; 235/492
See application file for complete search history.

(56) References Cited

U.S. PATENT DOCUMENTS

| | | | | |
|---|---|---|---|---|
| 4,843,225 | A * | 6/1989 | Hoppe | 235/492 |
| 5,608,262 | A | 3/1997 | Degani et al. | |
| 5,617,297 | A * | 4/1997 | Lo et al. | 361/737 |
| 5,650,755 | A | 7/1997 | Avanic et al. | |
| 6,320,256 | B1 * | 11/2001 | Ho | 257/691 |
| 6,544,047 | B2 * | 4/2003 | Moore | 439/95 |
| 6,693,362 | B2 | 2/2004 | Seyama | |
| 6,867,981 | B2 * | 3/2005 | Murohara | 361/737 |
| 7,076,870 | B2 * | 7/2006 | Hsieh | 29/852 |
| 7,306,144 | B2 * | 12/2007 | Moore | 235/380 |
| 2001/0033478 | A1 * | 10/2001 | Ortiz et al. | 361/818 |
| 2002/0079568 | A1 * | 6/2002 | Degani et al. | 257/686 |
| 2004/0203260 | A1 | 10/2004 | Block et al. | |
| 2005/0012192 | A1 | 1/2005 | Saso | |
| 2006/0027913 | A1 | 2/2006 | Lungwitz | |
| 2008/0042250 | A1 * | 2/2008 | Wilson et al. | 257/686 |

OTHER PUBLICATIONS

International Search Report for corresponding Application No. PCT/IB2007/002063 mailed Feb. 1, 2008.

* cited by examiner

*Primary Examiner* — Yuriy Semenenko
*Assistant Examiner* — Andargie M Aychillhum
(74) *Attorney, Agent, or Firm* — Renner, Otto, Boisselle & Sklar, LLP

(57) ABSTRACT

An electronic device is provided that includes a main printed circuit board (PCB) having a top surface, a bottom surface, and a hole extending between the top surface and the bottom surface. The electronic device further includes a module PCB having at least one electrical component mounted on a top surface of the module PCB, wherein the module PCB is inverted and assembled adjacent the main PCB such that the top surface of the module PCB faces the top surface of the main PCB, and the at least one electrical component extends into the hole. In addition, the electronic device includes a cover on the bottom surface of the main PCB that substantially covers the hole.

8 Claims, 2 Drawing Sheets

ELECTRONIC DEVICE WITH FLIP MODULE HAVING LOW HEIGHT

TECHNICAL FIELD OF THE INVENTION

The invention relates generally to electronic devices containing printed circuit boards (PCBs), and more particularly to an assembly of a main PCB and module PCB with reduced height and surface area requirements.

DESCRIPTION OF THE RELATED ART

Portable electronic devices have been popular for years, and will continue to grow in popularity. People have found that portable electronic devices have become a fundamental or even necessary part of their daily lives. Devices such as mobile phones, music players, personal digital assistants, electronic mail communicators, game systems, etc., are able to provide convenience, entertainment, etc.

Manufacturers of portable electronic devices are constantly striving to make such devices more attractive and/or practical to a consumer. One way for making the devices more attractive and/or practical is by reducing the size of the devices. By reducing their size, portable electronic devices may have a sleeker look, be carried more easily (e.g., such as in a shirt pocket or purse), etc.

Accordingly, there is a strong need in the art for a manner in which the size of electronic devices such as mobile phones, music players, personal digital assistants, etc., may be further reduced.

SUMMARY

In accordance with one aspect of the invention, an electronic device is provided that includes a main printed circuit board (PCB) having a top surface, a bottom surface, and a hole extending between the top surface and the bottom surface. The electronic device further includes a module PCB having at least one electrical component mounted on a top surface of the module PCB, wherein the module PCB is inverted and assembled adjacent the main PCB such that the top surface of the module PCB faces the top surface of the main PCB, and the at least one electrical component extends into the hole. In addition, the electronic device includes a cover on the bottom surface of the main PCB that substantially covers the hole.

In accordance with another aspect, the at least one electrical component includes radio frequency (RF) circuitry, and the cover serves as an RF shield.

According to still another aspect, one or more surfaces defining the hole include RF shielding material.

According to yet another aspect, a combined height of the assembled module PCB and main PCB is less than a sum of a height of the main PCB and a height of the module PCB with the at least one electrical component mounted thereon.

In accordance with another embodiment, the at least one electrical component includes an integrated circuit chip within a package.

According to still another aspect, the at least one electrical component includes an integrated circuit chip mounted directly on the top surface of the module PCB.

In accordance with yet another aspect, the electronic device is a mobile phone.

According to another aspect of the invention, an electronic device is provided that includes a main printed circuit board (PCB) having a top surface, a bottom surface, and a cavity formed in the top surface extending toward the bottom surface. The electronic device further includes a module PCB having at least one electrical component mounted on a top surface of the module PCB, wherein the module PCB is inverted and assembled adjacent the main PCB such that the top surface of the module PCB faces the top surface of the main PCB, and the at least one electrical component extends into the cavity.

With still another aspect, the at least one electrical component includes radio frequency (RF) circuitry, and one or more surfaces defining the cavity serve as an RF shield.

According to yet another aspect, the one or more surfaces comprises a metal layer formed thereon.

In accordance with another aspect, the at least one electrical component comprises an integrated circuit chip mounted directly on the top surface of the module PCB.

In accordance with still another aspect, a combined height of the assembled module PCB and main PCB is less than a sum of a height of the main PCB and a height of the module PCB with the at least one electrical component mounted thereon.

According to another aspect, the module PCB further includes at least one additional circuit component mounted on a bottom surface of the module PCB.

According to still another aspect, the at least one additional circuit component includes RF circuitry and an RF shield can covering the RF circuitry.

In accordance with another aspect, the RF circuitry includes an integrated circuit chip mounted directly on the bottom surface of the module PCB.

In accordance with yet another aspect, the electronic device is a mobile phone.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other object, advantages and novel features of the invention will become apparent from the following detailed description of the invention when considered in conjunction with the drawings.

It should be emphasized that the term "comprises/comprising" when used in this specification is taken to specify the presence of stated features, integers, steps or components but does not preclude the presence or addition of one or more other features, integers, steps, components or groups thereof.

DETAILED DESCRIPTION OF EMBODIMENTS

Figure 1:
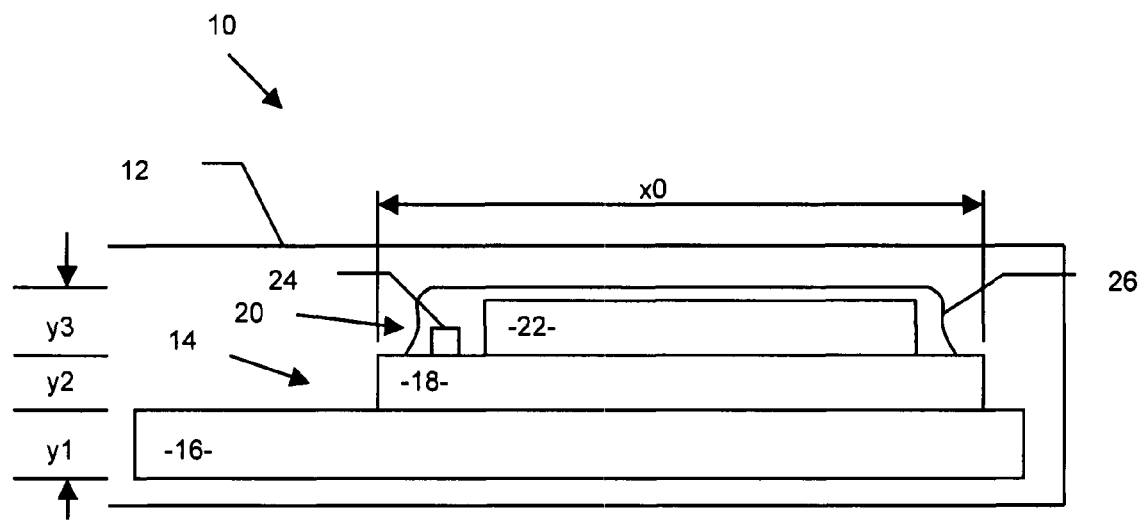
FIG. 1 is a schematic cross-section of main printed circuit board (PCB) and module PCB assembled together within an electronic device in conventional manner.

The present invention will now be described with reference to the drawings, wherein like reference numerals are used to refer to like elements throughout.

Referring initially to FIG. 1, a conventional electronic device such as a mobile phone 10 is shown in relevant part. The mobile phone 10 includes a housing 12 having enclosed therein a printed circuit board (PCB) assembly 14. The PCB assembly 14 includes a main PCB 16 and a module PCB 18 assembled on top of the main PCB 16. The main PCB 16 typically has various electronic components (e.g., discrete components, integrated circuits, keypad, display) mounted on a top surface of the main PCB 16. The various electronic components (not shown) enable the mobile phone 10 or other type electronic device to carry out its intended functions. Since the particular types of electronic components mounted on the main PCB 16 are not germane to the present invention, further detail has been omitted herein.

The module PCB 18 also includes one or more various electronic components mounted on a top surface thereof. For example, the module PCB 18 in the exemplary embodiment has mounted thereon a radio frequency (RF) module 20. The RF module 20 includes various RF circuitry designed to enable the mobile phone 10 to communicate wirelessly with other wireless devices and/or over a wireless network. Such RF circuitry may include one or more integrated circuit packages 22 (including an integrated circuit chip therein) and/or one or more discrete components 24, for example. Further, the RF module 20 may include an RF shield can 26 which covers the RF circuitry. As is known, the RF shield can 26 reduces/prevents unwanted RF emissions and/or interference. Various electrical interconnections between the main PCB 16 and the module PCB 18 may be provided through appropriate vias in the module PCB 18, connection pads formed on the bottom surface of the module PCB 18, bonding wires, etc. Such techniques are will known and are not germane to the present invention. Accordingly, further detail is omitted for sake of brevity.

As is known, module PCBs such as module PCB 18 are commonly used in conjunction with main PCBs such as main PCB 16 to facilitate ease of manufacture, interchangeability among different devices, etc. Unfortunately, however, the use of module PCBs assembled on top a main PCB as shown in FIG. 1 causes an increased height or thickness of the overall PCB assembly 14. For example, the main PCB 16 shown in FIG. 1 has a height of y1 and the module PCB 18 has a height of y2. The RF module 20 has a height of y3 (as defined by its maximum height represented by the RF shield can 26). Thus, the minimum overall height of the PCB assembly 14 is $H_{conv}=y1+y2+y3$. As a result, the mobile phone 10, and specifically the housing 12, will have a minimum overall height or thickness of y1+y2+y3.

Figure 2:
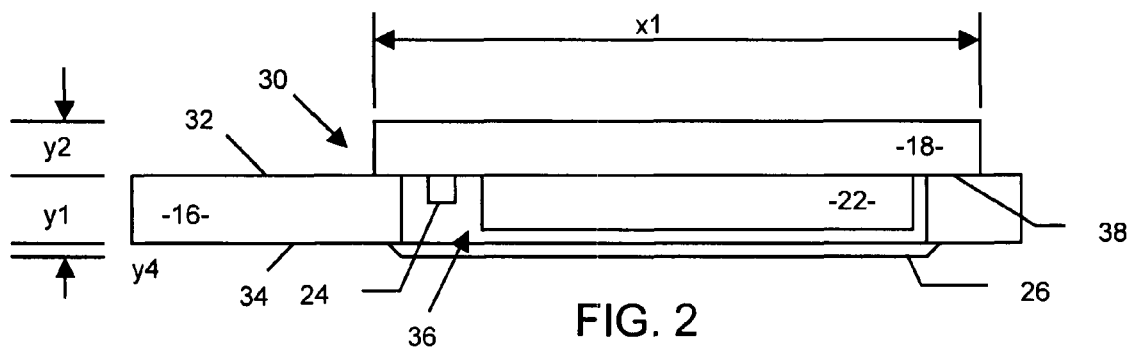
FIG. 2 is a schematic cross-section of a main PCB and module PCB assembled in accordance with one embodiment of the present invention.

Referring now to FIG. 2, a PCB assembly 30 in accordance with one embodiment of the present invention is shown. As will be appreciated based on the discussion herein, the PCB assembly 30 may be substituted in place of the PCB assembly 14 in FIG. 1 in order to result in a mobile phone or other electronic device 10 having a reduced height or thickness.

More specifically, the main PCB 16 according to the embodiment of FIG. 2 includes a top surface 32, a bottom surface 34, and a hole 36 extending between the top surface 32 and the bottom surface 34. The module PCB 18 has at least one electrical component (e.g., RF integrated circuit package 22, discrete component 24, etc.) mounted on a top surface 38 of the module PCB 18. As shown in FIG. 2, the module PCB 18 is inverted and assembled adjacent the main PCB 16 such that the top surface 38 of the module PCB 18 faces the top surface 32 of the main PCB 16 and the at least one electrical component (e.g., RF integrated circuit package 22, discrete component 24, etc.) extends into the hole 36. A cover, in this case in the form of the RF shield can 26, is provided on the side of the bottom surface 34 of the main PCB 16 and substantially covers the hole 36. In another embodiment in which an RF shield can is unnecessary (e.g., in a non-RF type electronic device 10), the cover 26 may be any type of cover, such as a metal or plastic cover, which prevents exposure of the electrical components(s) mounted on the top surface 38 of the module PCB 18. If desired, the hole 36 may be further filled with thermal leading material to transport heat from the at least one electrical component.

In the embodiment shown in FIG. 2, the height of the RF integrated circuit package 22 and discrete component(s) 24 is assumed to be less than the thickness or height y1 of the main PCB 16. Consequently, the height y4 of the RF shield can 26 in such embodiment can be nominal (e.g., approximately flush with the bottom surface 34 of the main PCB 16). The overall height of the PCB assembly 30 is therefore $H_{emb1}=y1+y2+y4$. Compared to FIG. 1, y4 is much less than y3, and therefore $H_{emb1}$ is much less than $H_{conv}$.

It will be appreciated that even if the height of the RF integrated circuit package 22 and discrete component(s) 24 was greater than the thickness or height y1 of the main PCB 16, the embodiment of FIG. 2 would still result in a reduction in thickness as compared to FIG. 1. In such case, the RF integrated circuit package 22 and/or discrete component(s) 24 would simply extend all the way through the hole 36. The RF shield can (cover) 26 would of course need to be of sufficient height to cover the components to the extent they extend through the hole 36. Nevertheless, the principles of the present invention would result in a reduction in the overall height of the assembly by the amount of y1 (i.e., the height of the main PCB 16) as will be appreciated.

It is further noted that in the embodiment of FIG. 2, the overall width of the module PCB 18 is equal to x1. Such width is approximately equal to the overall width x0 of the module PCB 18 in accordance with the conventional arrangement to FIG. 1. Thus, the embodiment of FIG. 2 provides an overall reduction in height of the PCB assembly, but does not necessarily provide a reduction in the overall width of the module PCB.

Figure 3:
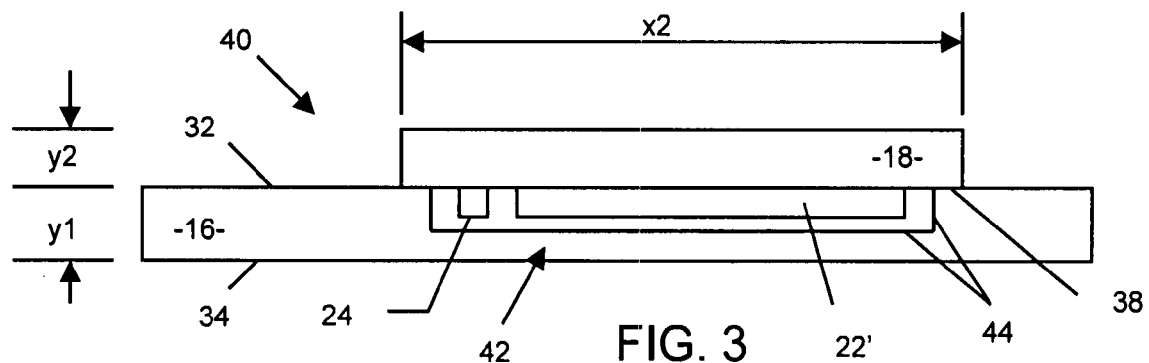
FIG. 3 is a schematic cross-section of a main PCB and module PCB assembled in accordance with another embodiment of the present invention.

FIG. 3 illustrates an embodiment of the invention which provides both a reduction in the overall height of the PCB assembly and a reduction in the overall width of the module PCB, thus also reducing the overall surface area needed on the main PCB. More specifically, FIG. 3 shows a PCB assembly 40 which may be substituted in place of the PCB assembly 14 in FIG. 1 in order to result also in a mobile phone or other electronic device 10 having a reduced height or thickness. Again, the main PCB 16 has a top surface 32 and a bottom surface 34. In this embodiment, however, a cavity 42 is formed in the top surface 32 and extends toward the bottom surface 34. The cavity 42 differs from the hole 36 in the embodiment of FIG. 2 in that the cavity 42 does not extend all the way through the main PCB 16 from the top surface 32 to the bottom surface 34.

The embodiment of FIG. 3 is particularly suitable when using very low height components mounted to the module PCB 18. For example, the RF integrated circuit package 22 of the previous embodiments may be replaced with a reduced height version, namely RF integrated circuit 22' in the form of a chip (also referred to as a "die") that may be mounted directly on the top surface 38 of the module PCB 18. A variety of technologies are known for producing such a reduced height integrated circuit 22', including surface mount, flip-chip, chip-on-board, chip-in-board, etc. Accordingly, further detail is omitted for sake of brevity.

The depth of the cavity 42 is designed to be greater than the height of the RF integrated circuit 22' and discrete component(s) 24. Consequently, the module PCB 18 may be inverted and assembled adjacent the main PCB 16 as shown in FIG. 3 such that the top surface 38 of the module PCB 18 faces the top surface 32 of the main PCB 16 and the RF integrated circuit 22' and discrete component(s) 24 extend into the cavity 42. Moreover, instead of requiring a separate RF shield can 26 as in the previous embodiments, the PCB assembly 40 is capable of using the main PCB 16 itself as an RF shield. More particularly, one or more surfaces 44 of the cavity 42 have a metal or other conductive layer formed thereon for serving as an RF shield. The metal layer may be formed easily during the circuit board fabrication process as will be appreciated, and thereby avoids the need for a separate RF shield can 26.

As a result, the PCB assembly 40 provides an overall height of $H_{emb2}$=y1+y2, where y1 is equal to the height of the main PCB 16 and y2 is equal to the height of the module PCB 18. This is significantly less than the height $H_{conv}$ of a conventional device as described above with respect to FIG. 1, and equal to or less than the height $H_{emb1}$ described in connection with the embodiment of FIG. 2.

The embodiment of FIG. 3 is further advantageous in that the reduced height components on the module PCB 18 provide for a reduction in the overall width of the module PCB 18. This in turn provides for more available surface area on the main PCB 16 and/or reduced width of the main PCB 16. Reduced height components (e.g., surface mount, flip-chip, chip-on-board, chip-in-board, etc.) typically are smaller in width than their conventionally packaged counterparts (e.g., RF integrated circuit package 22 compared to RF integrated circuit 22'). Thus, the width x2 of the module PCB 18 may be much less than the width x0 of the device in FIG. 1, and the width x1 of the embodiment of FIG. 2.

Figure 4:
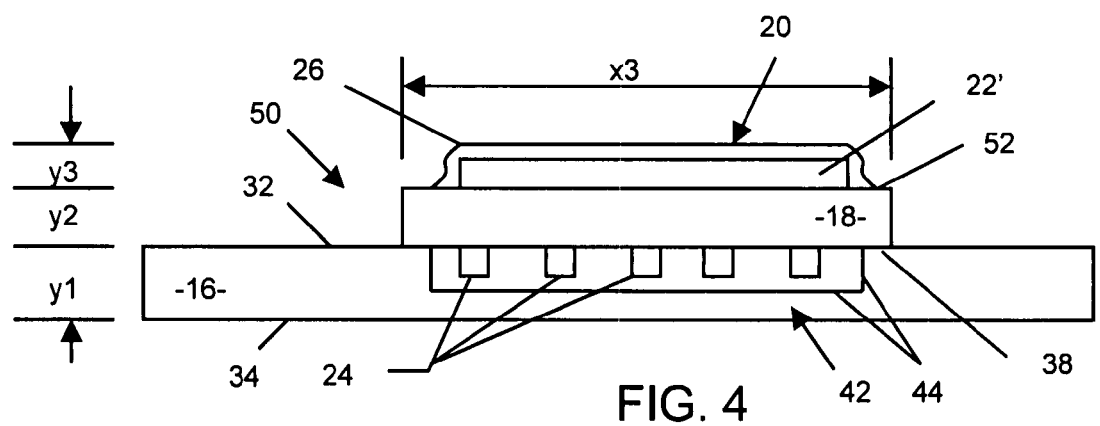
FIG. 4 is a schematic cross-section of a main PCB and module PCB assembled in accordance with yet another embodiment of the present invention.

FIG. 4 illustrates yet another embodiment of the invention that may be included in an electronic device 10 such as a mobile phone. In this embodiment, a PCB assembly 50 provides an even further reduction in the width of the module PCB 18 as compared to the embodiment of FIG. 3, although at the expense of an increased height. However, even with the increase in overall height the PCB assembly 50 has a reduced height compared to the conventional device of FIG. 1.

The PCB assembly 50 is similar to the PCB assembly 40 in the embodiment of FIG. 3 with the following exception. In the PCB assembly 50, electrical components are formed on both the upper and lower sides of the module PCB 18 so as to reduce the overall width x3 of the module PCB 18. Using well known double-sided circuit board produced techniques, the module PCB 18 has one or more electrical components (e.g., discrete components 24) formed on one side and one or more electrical components (e.g., RF integrated circuit 22') formed on the other side. Consequently, the double-sided module PCB 18 requires less surface area than a single-sided module PCB 18 as described in the previous embodiments. The module PCB 18 may therefore be of reduced width dimension (e.g., x3 is less than x2 from the embodiment of FIG. 3).

In the specific embodiment shown in FIG. 4, the discrete components 24 are located on the top surface 38 of the inverted module PCB 18 and extend into the cavity 42 formed in the top surface 32 of the main PCB 16. The RF integrated circuit 22' requiring RF shielding is formed on the bottom surface 52 of the inverted module PCB 18. As a result, the embodiment includes an RF shield can 26 mounted on the bottom surface 52 and covering the RF integrated circuit 22'. In another embodiment (not shown), the RF integrated circuit 22' may be positioned on the top surface 38 of the inverted PCB 18 so as to extend into the cavity 42. The discrete components 24 are formed on the bottom surface 52 of the inverted PCB 18. Similar to the embodiment of FIG. 3, the surfaces 44 of the cavity 42 may have a metal or other conductive layer formed thereon for serving as an RF shield. Accordingly, there is then no need for the RF shield can 26 and the height associated therewith. Alternatively, in an embodiment where both the electrical components on the top surface 38 and the bottom surface 52 of the module PCB 18 require RF shielding, a conductive layer on the surfaces 44 of the cavity 42 may serve as the RF shield for the components on the top surface 38. Moreover, an RF shield can 26 may be provided on the bottom surface 52 to cover and serve as a shield for the electrical components on the bottom surface 52.

As for the particular embodiment shown in FIG. 4, the overall height $H_{emb3}$ is equal to y1+y2+y3, similar to that of the conventional device shown in FIG. 1. In the embodiment of FIG. 4, however, the RF module 20 has a height of y3 (as defined by its maximum height represented by the RF shield can 26) which is less than the corresponding height y3 in the conventional device of FIG. 1. Thus, the embodiment of FIG. 4 offers both a reduction in the overall height of the PCB assembly and a reduction in the width of the module PCB 18 (e.g., x3 is less than x0) as discussed above.

The term "electronic device" as referred to herein includes portable radio communication equipment. The term "portable radio communication equipment", also referred to herein as a "mobile radio terminal", includes all equipment such as mobile phones, pagers, communications, e.g., electronic organizers, personal digital assistants (PDAs), smartphones or the like.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

The invention claimed is:

1. An electronic device, comprising: a main printed circuit board (PCB) having a top surface, a bottom surface, and a cavity formed in the top surface extending toward the bottom surface but not through the main PCB, wherein one or more surfaces defining the cavity serve as a first RF shield; and
   a module PCB having at least one electrical component mounted on a top surface of the module PCB and at least one circuit component mounted on a bottom surface of the module PCB, wherein the module PCB is inverted and assembled adjacent the main PCB such that the top surface of the module PCB faces the uppermost top surface of the main PCB, and the at least one electrical component mounted on the top surface of the module PCB extends into the cavity;
   wherein the at least one circuit component mounted on the bottom surface of the module PCB comprises radio frequency (RF) circuitry; and
   wherein the module PCB includes a further RF shield, the further RF shield comprising an RF shield can covering the RF circuitry.

2. The electronic device of claim 1, wherein the at least one electrical component comprises radio frequency (RF) circuitry.

3. The electronic device of claim 1, wherein the one or more surfaces comprises a metal layer formed thereon.

4. The electronic device of claim 1, wherein the at least one electrical component further comprises an integrated circuit chip mounted directly on the top surface of the module PCB.

5. The electronic device of claim 1, wherein a combined height of the assembled module PCB and main PCB is less than a sum of a height of the main PCB and a height of the module PCB with the at least one electrical component mounted thereon.

6. The electronic device of claim 1, wherein the RF circuitry comprises an integrated circuit chip mounted directly on the bottom surface of the module PCB.

7. The electronic device of claim 1, wherein the electronic device is a mobile phone.

8. The electronic device of claim 1, wherein the top surface of the module PCB engages the uppermost top surface of the main PCB.

* * * * *

UNITED STATES PATENT AND TRADEMARK OFFICE
CERTIFICATE OF CORRECTION

PATENT NO.         : 7,965,520 B2
APPLICATION NO.    : 11/625426
DATED              : June 21, 2011
INVENTOR(S)        : Bygdö et al.

It is certified that error appears in the above-identified patent and that said Letters Patent is hereby corrected as shown below:

IN THE SPECIFICATIONS:

Column 3, line 32 "Such techniques are will known and are not germane to the present invention" should read -- Such techniques are well known and are not germane to the present invention --

Column 5, line 47 "Using well known double-sided circuit board produced techniques, the module PCB 18 has one or more electrical components..." should read -- Using well known double-sided circuit board production techniques, the module PCB 18 has one or more electrical components... --

Column 6, line 28 "...includes all equipment such as mobile phones, pagers, communications, e.g., electronic organizers, personal digital assistants (PDAs), smartphones or the like." should read -- ...includes all equipment such as mobile phones, pagers, communicators, e.g., electronic organizers, personal digital assistants (PDAs), smartphones or the like. --

Signed and Sealed this
Thirtieth Day of August, 2011

David J. Kappos
*Director of the United States Patent and Trademark Office*